US011386321B2

(12) United States Patent
Oshima et al.

(10) Patent No.: US 11,386,321 B2
(45) Date of Patent: Jul. 12, 2022

(54) NEURAL NETWORK CIRCUIT

(71) Applicant: HITACHI, LTD., Tokyo (JP)

(72) Inventors: Takashi Oshima, Tokyo (JP); Atsutake Kosuge, Tokyo (JP); Taizo Yamawaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 729 days.

(21) Appl. No.: 16/411,269

(22) Filed: May 14, 2019

(65) Prior Publication Data
US 2019/0392298 A1 Dec. 26, 2019

(30) Foreign Application Priority Data
Jun. 21, 2018 (JP) .............................. JP2018-117762

(51) Int. Cl.
*G06N 3/06* (2006.01)
*G06F 7/544* (2006.01)
*G06N 3/063* (2006.01)
*H03K 19/20* (2006.01)

(52) U.S. Cl.
CPC ......... *G06N 3/0635* (2013.01); *G06F 7/5443* (2013.01); *H03K 19/20* (2013.01)

(58) Field of Classification Search
CPC .. G06N 3/0635; G06N 3/0481; G06F 7/5443; G06F 2207/4814; H03K 19/20
See application file for complete search history.

(56) References Cited

U.S. PATENT DOCUMENTS 5,361,219 A 11/1994 Shou et al.
2022/0075596 A1* 3/2022 Agrawal ................. H03M 1/68

FOREIGN PATENT DOCUMENTS

JP 06-168349 A 6/1994

OTHER PUBLICATIONS

F. Saffar, M. Mirhassani and M. Ahmadi, "A neural network architecture using high resolution multiplying digital to analog converters ,"2017 IEEE 60th International Midwest Symposium on Circuits and Systems (MWSCAS), 2017, pp. 1454-1457, doi: 10.1109/MWSCAS.2017.8053207. (Year: 2017).*
Jenn-Chyou Bor and Chung-Yu Wu, "Realization of the CMOS pulsewidth-modulation (PWM) neural network with on-chip learning," in IEEE Transactions on Circuits and Systems II: Analog and Digital Signal Processing, vol. 45, No. 1, pp. 96-107, Jan. 1998, doi: 10.1109/82.659460. (Year: 1998).*

* cited by examiner

*Primary Examiner* — Ajay Ojha
(74) *Attorney, Agent, or Firm* — Volpe Koenig

(57) ABSTRACT

A neural network circuit having a plurality of analog-to-digital multipliers generates an analog product-sum voltage corresponding to the sum of charge signals of each of the analog-to-digital multipliers.

13 Claims, 6 Drawing Sheets

NEURAL NETWORK CIRCUIT

BACKGROUND OF THE INVENTION

1. Field of the Invention

The present invention relates to a neural network circuit.

2. Description of the Related Art

Artificial intelligence, that is, AI, is expected to make a breakthrough in various fields including situation recognition and automatic driving based on big data obtained from a large number of sensors.

However, in order for AI to demonstrate the ability that exceeds conventional deductive processing, it is necessary that AI is trained to learn processing necessary for large-scale neural network circuits, and also large-scale neural network circuits that have already been learned are used to make an inference.

Therefore, under the present circumstances, in order to perform image recognition, language translation, and the like by AI, a Graphics Processing Unit (GPU) is operated in parallel and repeatedly operated to operate large-scale neural network circuits. However, the increase in power consumption associated with parallel operation, and the increase in power consumption and operation delay time associated with memory access necessary for repetitive operation have been a problem.

In the future, it is considered that a further large scale neural network circuit will be required to meet task complexity expected of AI and the demand for further high recognition accuracy. As a result, it is expected that power consumption and operation delay time will be further increased. On the other hand, from the demand for real-time performance, communication traffic reduction, security etc., the realization of low power and high speed AI on edge terminals with limited power budget is beginning to be expected.

Therefore, in place of the conventional digital circuit operation, a neural network circuit incorporating power-efficient analog circuit operations with low memory access frequency is beginning to be considered.

In general, neural network circuits make extensive use of product-sum operations and non-linear operations called activation functions. For example, JP H06-168349 A describes a method of multiplication by an analog circuit using a capacitive element and a switch.

SUMMARY OF THE INVENTION

However, in the method described in JP H06-168349 A, the area occupied by a capacitive element or a switch is increased. For this reason, large-scale neural network circuits cannot be integrated on a chip, and only simple tasks can be performed. In addition, in the case of repeatedly reusing computing resources on the same chip, an increase in power consumption and operation delay time associated with access to a memory necessary therefor becomes a problem.

An object of the present invention is to integrate, on a chip, large-scale neural network circuits incorporating high speed and low power analog operations.

A neural network circuit according to one aspect of the present invention, includes a plurality of D/A converters that converts a digital input signal into an analog input voltage, a plurality of analog-to-digital multipliers each connected to the D/A converters and that outputs a predetermined multiplication result obtained by multiplying the analog input voltage by a weighting factor which is a digital signal, and an analog activation function circuit that performs analog processing corresponding to an activation function on the result obtained by adding the multiplication result output from a plurality of the analog-to-digital multipliers. Each of the analog-to-digital multipliers includes an output node to which the analog-to-digital input voltage is connected, and a MOS transistor provided corresponding to at least one bit signal corresponding to the digital signal. The MOS transistor has a source terminal, a drain terminal, and a gate terminal. The source terminal and the drain terminal are connected to the output node. A voltage based on the bit signal is applied to the gate terminal. A charge signal corresponding to the product of the analog input voltage and the bit signal is output as the multiplication result. A plurality of the analog-to-digital multipliers generates an analog product-sum voltage corresponding to the sum of the charge signals of respective analog-to-digital multipliers by connecting the output nodes.

A neural network circuit according to one aspect of the present invention, includes a plurality of D/A converters that converts a digital input signal into an analog input voltage, a plurality of analog-to-digital multipliers each connected to the D/A converters and that outputs a predetermined multiplication result obtained by multiplying the analog input voltage by a weighting factor which is a digital signal, and an analog activation function circuit that performs analog processing corresponding to an activation function on the result obtained by adding the multiplication result output from a plurality of the analog-to-digital multipliers. Each of the analog-to-digital multipliers includes an output node to which the analog-to-digital input voltage is connected, and a MOS transistor provided corresponding to at least one bit signal corresponding to the digital signal. The MOS transistor has a source terminal, a drain terminal, and a gate terminal. The gate terminal is connected to the output node. A voltage based on the bit signal is applied to the source terminal and the drain terminal. A charge signal corresponding to the product of the analog input voltage and the bit signal is output as the multiplication result. A plurality of the analog-to-digital multipliers generates an analog product-sum voltage corresponding to the sum of the charge signals of respective analog-to-digital multipliers by connecting the output nodes.

A neural network circuit according to one aspect of the present invention includes a plurality of first D/A converters that converts a digital input signal into an analog input voltage, a plurality of analog-to-digital multipliers each connected to the first D/A converters and that outputs a predetermined multiplication result, as an analog signal, obtained by multiplying the analog input voltage by a weighting factor which is a digital signal, an A/D converter that converts a result obtained by adding the multiplication result as an analog signal into a digital signal, a digital activation function circuit that performs digital processing corresponding to an activation function on the result obtained by adding the multiplication result as the digital signal output from the A/D converter, and a second D/A converter that converts a digital output signal of the digital activation function circuit into an analog voltage. Each of the analog-to-digital multipliers includes an output node to which the analog-to-digital input voltage is connected, and a MOS transistor provided corresponding to at least one bit signal corresponding to the digital signal. The MOS transistor has a source terminal, a drain terminal, and a gate terminal. The source terminal and the drain terminal are connected to the output node. A voltage based on the bit signal is applied to the gate terminal. A charge signal corresponding to the product of the analog input voltage and the bit signal is output as the multiplication result. A plurality of the analog-to-digital multipliers generates an analog product-sum voltage corresponding to the sum of the charge signals of respective analog-to-digital multipliers by connecting the output nodes.

According to one aspect of the present invention, large scale neural network circuits incorporating high speed and low power analog operations can be integrated on a chip.

DESCRIPTION OF THE PREFERRED EMBODIMENTS

Examples will be described below with reference to the drawings.

First Embodiment

Figure 1:
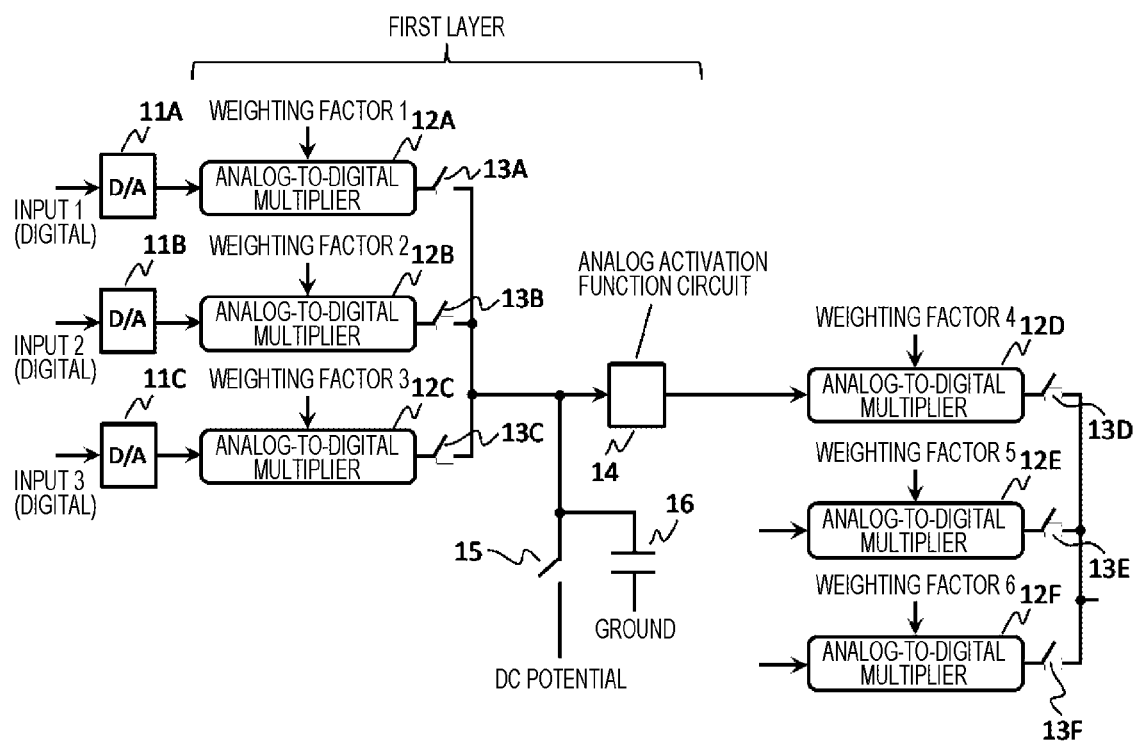
FIG. 1 is a diagram illustrating a configuration of a neural network circuit of a first embodiment.

A configuration of a neural network circuit of a first embodiment will be described with reference to FIG. 1. As illustrated in FIG. 1, a large number of digital signals is input to the neural network circuit of the first embodiment. Among a large number of digital signals, for example, three input signals; input 1, input 2, and input 3, are converted into analog voltages by a D/A converter 11A, a D/A converter 11B, and a D/A converter 11C, respectively. The respective analog voltages are input to an analog-to-digital multiplier 12A, an analog-to-digital multiplier 12B, and an analog-to-digital multiplier 12C.

A weighting factor 1, a weighting factor 2, and a weighting factor 3 which are digital signals are input to the analog-to-digital multiplier 12A, the analog-to-digital multiplier 12B, and the analog-to-digital multiplier 12C, respectively. The analog-to-digital multiplier 12A outputs a first charge signal corresponding to a multiplication result obtained by multiplying an analog voltage output from the D/A converter 11A and the weighting factor 1 which is a digital signal.

Similarly, the analog-to-digital multiplier 12B outputs a second charge signal corresponding to a multiplication result obtained by multiplying the analog voltage output from the D/A converter 11B and the weighting factor 2 which is a digital signal. Similarly, the analog-to-digital multiplier 12C outputs a third charge signal corresponding to a multiplication result obtained by multiplying the analog voltage output from the D/A converter 11C and the weighting factor 3 which is a digital signal.

An output of the analog-to-digital multiplier 12A is connected to the switch 13A, an output of the analog-to-digital multiplier 12B is connected to the switch 13B, and an output of the analog-to-digital multiplier 12C is connected to the switch 13C. When the switch 13A, the switch 13B, and the switch 13C are turned on, the outputs of the analog-to-digital multiplier 12A, the analog-to-digital multiplier 12B, and the analog-to-digital multiplier 12C are mutually connected.

As a result, a first product-sum voltage corresponding to the sum of the first charge signal, the second charge signal, and the third charge signal is generated. Furthermore, the other ends of the switch 13A, the switch 13B, and the switch 13C are connected to an analog activation function circuit 14. The analog activation function circuit 14 is an analog circuit that simulates activation function calculations required as a neural network, such as a step function, a sigmoid function, or a ReLU (Rectified Linear Unit). The analog activation function circuit 14 performs processing corresponding to the required activation function on the input first product-sum voltage and outputs it as an analog voltage. The first product-sum voltage is generated on a parasitic capacitance formed between a wiring from the switch 13A, the switch 13B, and the switch 13C to the analog activation function circuit 14 and a ground, a power supply wiring, and the like, that is, generated on a wiring capacitance 16. Further, while the switch 13A, the switch 13B, and the switch 13C are turned off, a switch 15 inserted between the wiring and a DC potential (including a ground and a power supply voltage) is turned on, whereby an alternating current component of the charge on the wiring capacitance 16 is discharged to zero in advance. If a capacitance value of the wiring capacitance 16 is not sufficient, a capacitance element may be inserted between the wiring and any DC potential as an additional capacitance.

In the first embodiment, a group of portions starting with the analog-to-digital multipliers 12A to 12C and ending with the analog activation function circuit 14 is referred to as a "layer". The analog-to-digital multiplier 12A, the analog-to-digital multiplier 12B, the analog-to-digital multiplier 12C, the switch 13A, the switch 13B, the switch 13C, the switch 15, the wiring capacitance 16, and the analog activation function circuit 14 are included in a first layer.

That is, an analog voltage output from the analog activation function circuit 14 is a first output of the first layer. The first output of the first layer, which is an analog voltage, is input to the analog-to-digital multiplier 12D of a second layer. Further, although not illustrated, a second output of the first layer generated with the same configuration is input to an analog-digital multiplier 12E. Further, although not illustrated as well, a third output of the first layer generated with the same configuration is input to an analog-to-digital multiplier 12F. Thereafter, a product-sum operation and activation function processing are performed in the second layer as with the first layer and transmitted to the third layer. The above-described processing is performed up to a deep layer on a large number of digital signals input to the neural network circuit of the first embodiment, and an AI recognition result is obtained from each output of the final layer.

The configuration of the analog-to-digital multipliers 12A to 12C will be described with reference to FIG. 3. An analog input voltage $V_{IN}$ of the analog-to-digital multipliers 12A to 12C is connected to an output node OUT via a switch 31. On/off of the switch 31 is controlled based on a clock signal φ. In addition, digital input signals of the analog-to-digital multipliers 12A to 12C, which are weighting factors, are represented by one or a plurality of bit signals. The first embodiment shows an example of four bits.

The analog-to-digital multipliers 12A to 12C each include a MOS transistor 32, a MOS transistor 33, a MOS transistor 34, and a MOS transistor 35 corresponding to four bit signals. These are NMOS. The source terminal and the drain terminal of each MOS transistor are connected to an output node, and a voltage based on each bit signal is applied to the gate terminal.

That is, when the weighting factor is represented by four-bit bit signals, W3, W2, W1 and W0, a logical product (AND) output signal of the clock signal φ and the W3 signal is applied to the gate terminal of the MOS transistor 32. Further, to the gate terminal of the MOS transistor 33, a logical product (AND) output signal of the clock signal φ and the W2 signal is applied. Further, to the gate terminal of the MOS transistor 34, a logical product (AND) output signal of the clock signal φ and the W1 signal is applied. Further, to the gate terminal of the MOS transistor 35, a logical product (AND) output signal of the clock signal φ and the W0 signal is applied.

The back gate terminals of the MOS transistor 32, the MOS transistor 33, the MOS transistor 34, and the MOS transistor 35 are connected to a ground potential which is a DC potential. Note that these back gate terminals may be connected to a DC potential other than the ground potential. Here, when W3 is MSB (Most Significant Bit) and W0 is LSB (Least Significant Bit) in the representation of the weighting factors by W3, W2, W1, and W0 bit signals, for example, the gate width ratio of the MOS transistor 32, the MOS transistor 33, the MOS transistor 34, and the MOS transistor 35 may be selected to be 8:4:2:1.

The operation of the neural network circuit of the first embodiment will be described with reference to FIG. 9. As shown in the time chart of FIG. 9, analog output voltages of the D/A converter 11A, the D/A converter 11B, and the D/A converter 11C of the first stage in FIG. 1 are changed like the waveforms at the top of FIG. 9. On the other hand, the clock signal φ of each of the analog-to-digital multipliers 12A to 12C belonging to the first layer has a waveform of "first layer φ" in FIG. 9.

Figure 3:
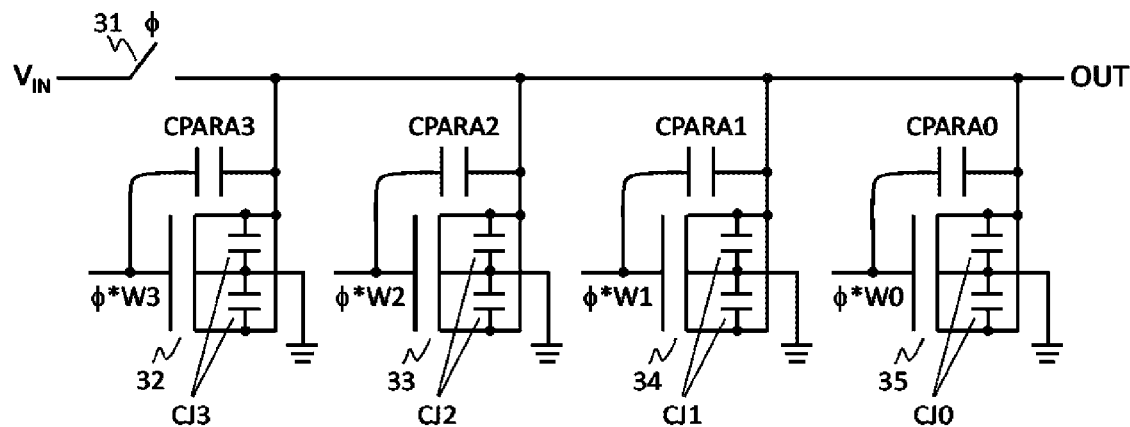
FIG. 3 is a diagram illustrating a configuration of an analog-to-digital multiplier of the first embodiment.
Figure 9:
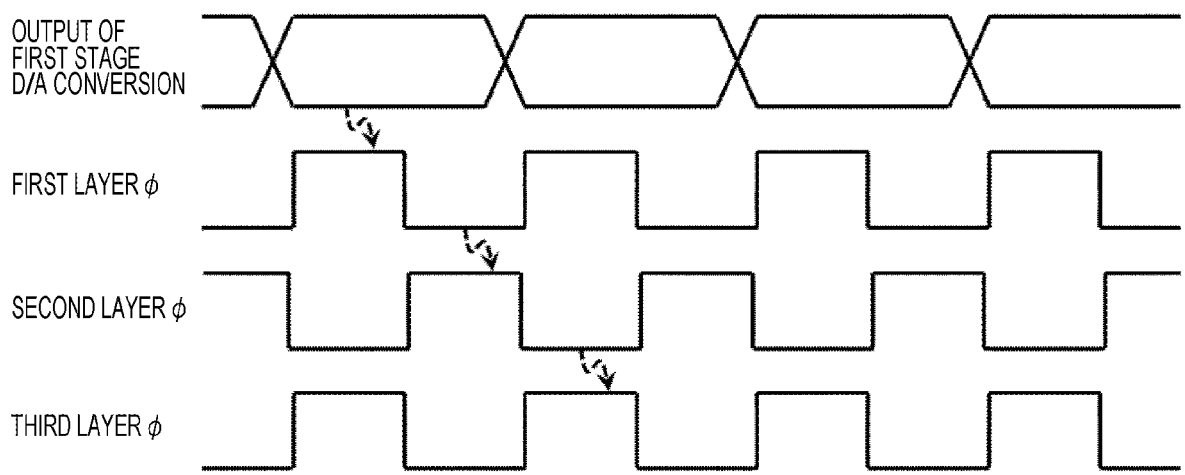
FIG. 9 is a diagram illustrating an operation time chart of the first embodiment.

While the clock signal φ is at high voltage, the switch 31 in FIG. 3 is turned on, and the analog input voltage $V_{IN}$, that is, "output of first stage D/A conversion" in FIG. 9 is applied onto the output node OUT. During the period, the switch 13A, the switch 13B, and the switch 13C in FIG. 1 are turned off. On the other hand, the switch 15 is turned on to discharge an alternating current component of the charge on the wiring capacitance 16 to zero.

As described above, to the gate terminal of the MOS transistor 32, a logical product (AND) output signal of the clock signal φ and the W3 signal is applied. To the gate terminal of the MOS transistor 33, a logical product (AND) output signal of the clock signal φ and the W2 signal is applied. To the gate terminal of the MOS transistor 34, a logical product (AND) output signal of the clock signal φ and the W1 signal is applied. To the gate terminal of the MOS transistor 35, a logical product (AND) output signal of the clock signal φ and the W0 signal is applied.

Therefore, among the W3, W2, W1, and W0 bit signals, the gate voltage of the MOS transistor corresponding to a high voltage (logical value=1) bit signal is at high voltage, that is, a voltage equal to a power supply voltage. Further, the gate voltage of the MOS transistor corresponding to a low voltage (logical value=0) bit signal is at low voltage, that is, a ground potential.

Therefore, the MOS transistor corresponding to a high voltage bit signal is turned on, and a channel capacitance proportional to a gate width is formed between the gate terminal, the source terminal, and the drain terminal of the MOS transistor. The source terminal and the drain terminal are connected to the output node OUT to which the analog input voltage $V_{IN}$ is applied. Therefore, a charge corresponding to the product of the analog input voltage $V_{IN}$ and the gate width is charged in the channel capacitance of the MOS transistor corresponding to a high voltage bit signal. On the other hand, a MOS transistor corresponding to a bit signal at low voltage is turned off, and a channel capacitance is not formed, such that an electrical charge is not charged either.

From the above, the total charge amount charged in the MOS transistor 32, the MOS transistor 33, the MOS transistor 34, and the MOS transistor 35 while the clock signal φ is at high voltage is proportional to $V_{IN} \times (8 \times W3 + 4 \times W2 + 2 \times W1 + 1 \times W0)$. That is, the charge amount corresponds to the product of the analog input voltage and the value of the weighting factor.

CPARA3, CPARA2, CPARA1 and CPARA0 in FIG. 3 are the sum of a channel capacitance value, an overlap capacitance value of a fixed value between the gate terminal and the source terminal, and an overlap capacitance value of a fixed value between the gate terminal and the drain terminal. As described above, the presence or absence of a channel capacitance value is controlled. Further, CJ3, CJ2, CJ1 and CJ0 in FIG. 3 are junction capacitance values of fixed values of the MOS transistor 32, the MOS transistor 33, the MOS transistor 34, and the MOS transistor 35. In the present invention, as described above, it is necessary that the channel capacitance value capable of controlling the presence or absence is sufficiently larger than the sum of the fixed overlap capacitance value and the junction capacitance value. Therefore, gate lengths of the MOS transistor 32, the MOS transistor 33, the MOS transistor 34, and the MOS transistor 35 are made long as necessary to satisfy this condition.

While the clock signal φ is at low voltage, the switch 31 is turned off, and an analog input voltage is cut off from the output node OUT. As described above, to the gate terminal of the MOS transistor 32, a logical product (AND) output signal of the clock signal φ and the W3 signal is applied. To the gate terminal of the MOS transistor 33, a logical product (AND) output signal of the clock signal φ and the W2 signal is applied. To the gate terminal of the MOS transistor 34, a logical product (AND) output signal of the clock signal φ and the W1 signal is applied. To the gate terminal of the MOS transistor 35, a logical product (AND) output signal of the clock signal φ and the W0 signal is applied. Therefore, while the clock signal φ is at low voltage, the gate voltages of the MOS transistor 32, the MOS transistor 33, the MOS transistor 34, and the MOS transistor 35 are all at low voltage, that is, a ground potential.

Therefore, the MOS transistor 32, the MOS transistor 33, the MOS transistor 34, and the MOS transistor 35 are all turned off, and a channel capacitance disappears. Therefore, the charge amount corresponding to the product of the analog input voltage and the value of the weighting factor is discharged from the MOS transistor 32, the MOS transistor 33, the MOS transistor 34, and the MOS transistor 35 toward the output node OUT as a charge signal.

The switch 13A, the switch 13B, and the switch 13C in FIG. 1 are turned on while the clock signal φ of the first layer is at low voltage. Thus, the outputs of the analog-to-digital multiplier 12A, the analog-to-digital multiplier 12B, and the analog-to-digital multiplier 12C are connected to one another, and charge signals discharged therefrom are added. The added charge signal is charged on the wiring capacitance 16 to generate a first product-sum voltage. During this period, the switch 15 is turned off.

Furthermore, while the clock signal φ of the first layer is at low voltage, the analog activation function circuit 14 performs processing corresponding to an activation function on the first product-sum voltage and outputs it as an analog voltage. The second-layer analog-to-digital multiplier 12D, the analog-to-digital multiplier 12E, and the analog-to-digital multiplier 12F perform the above operation according to the clock signal φ of the second layer in FIG. 9.

The respective analog-to-digital multipliers of the second layer perform the charging of a charge while the respective analog-to-digital multipliers of the first layer discharge charge. Therefore, the clock signal φ of the second layer is shifted by a half cycle with respect to the clock signal φ of the first layer. Similarly, since the clock signal φ of the third layer only needs to be shifted by a half cycle with respect to the clock signal φ of the second layer, it has the same waveform as the clock signal φ of the first layer.

As described above, in the first embodiment, one MOS transistor is used both in a capacitive element and a switch element by utilizing the on/off characteristics of the channel capacitance of the MOS transistor, and analog product-sum operation is performed in a charge region. As a result, the product-sum operations can be realized by a small-area analog circuit, and a large-scale neural network circuit can be integrated on a chip.

Second Embodiment

Figure 2:
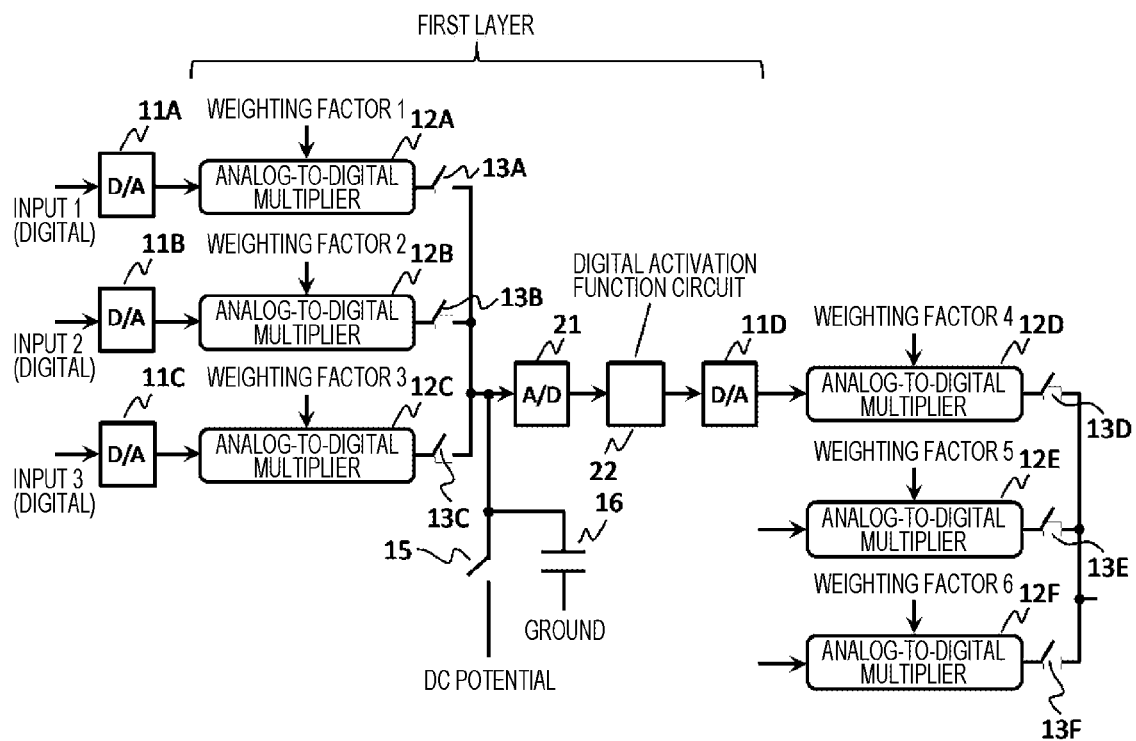
FIG. 2 is a diagram illustrating a configuration of a neural network circuit of a second embodiment.

The configuration of a neural network circuit of a second embodiment will be described with reference to FIG. 2. As illustrated in FIG. 2, a large number of digital signals is input to the neural network circuit of the second embodiment. Among a large number of digital signals, for example, three input signals; input 1, input 2, and input 3, are converted into analog voltages by a D/A converter 11A, a D/A converter 11B, and a D/A converter 11C, respectively. The respective analog voltages are input to an analog-to-digital multiplier 12A, an analog-to-digital multiplier 12B, and an analog-to-digital multiplier 12C.

A weighting factor 1, a weighting factor 2 and a weighting factor 3, which are digital signals, are also input to the analog-to-digital multiplier 12A, the analog-to-digital multiplier 12B, and the analog-to-digital multiplier 12C, respectively. The analog-to-digital multiplier 12A outputs a first charge signal corresponding to a multiplication result obtained by multiplying an analog voltage output from the D/A converter 11A and the weighting factor 1 which is a digital signal. The analog-to-digital multiplier 12B outputs a second charge signal corresponding to a multiplication result obtained by multiplying an analog voltage output from the D/A converter 11B and the weighting factor 2 which is a digital signal. The analog-to-digital multiplier 12C outputs a third charge signal corresponding to a multiplication result obtained by multiplying an analog voltage output from the D/A converter 11C and the weighting factor 3 which is a digital signal.

An output of the analog-to-digital multiplier 12A is connected to the switch 13A. An output of the analog-to-digital multiplier 12B is connected to the switch 13B. An output of the analog-to-digital multiplier 12C is connected to the switch 13C. When the switch 13A, the switch 13B, and the switch 13C are turned on, the outputs of the analog-to-digital multiplier 12A, the analog-to-digital multiplier 12B, and the analog-to-digital multiplier 12C are mutually connected. As a result, a first product-sum voltage corresponding to the sum of the first charge signal, the second charge signal, and the third charge signal is generated.

Furthermore, the other ends of the switch 13A, the switch 13B, and the switch 13C are connected to an A/D converter 21. The A/D converter 21 converts the first product-sum voltage into a digital value. An output of the A/D converter 21 is connected to a digital activation function circuit 22. The digital activation function circuit 22 is a digital circuit that performs an operation of an activation function required as a neural network, such as a step function, a sigmoid function, or ReLU. The digital activation function circuit 22 causes a digital value output from the A/D converter 21 to be subjected to processing corresponding to the necessary activation function and outputs it as a digital value. An output of the digital activation function circuit 22 is connected to a D/A converter 11D. The D/A converter 11D converts the output of the digital activation function circuit 22 into an analog voltage. The first product-sum voltage is formed on a parasitic capacitance formed between a wiring from the switch 13A, the switch 13B, and the switch 13C to the A/D converter 21 and a ground, a power supply wiring, and the like, that is, on the wiring capacitance 16. Further, while the switch 13A, the switch 13B, and the switch 13C are turned off, a switch 15 inserted between the wiring and a DC potential (including a ground and a power supply voltage) is turned on, whereby an alternating current component of the charge on the wiring capacitance 16 is discharged to zero in advance. If a capacitance value of the wiring capacitance 16 is not sufficient, a capacitance element may be inserted between the wiring and any DC potential as an additional capacitance.

In the second embodiment, a group of portions starting with the analog-to-digital multipliers 12A to 12C and ending with the D/A converter 11D is referred to as a "layer". The analog-to-digital multiplier 12A, the analog-to-digital multiplier 12B, the analog-to-digital multiplier 12C, the switch 13A, the switch 13B, the switch 13C, the switch 15, the wiring capacitance 16, the A/D converter 21, the digital activation function circuit 22, the D/A converter 11D are included in the first layer.

That is, the analog voltage output from the D/A converter 11D is a first output of the first layer. The first output of the first layer, which is an analog voltage, is input to the analog-to-digital multiplier 12D of a second layer. Further, although not illustrated, a second output of the first layer generated with the same configuration is input to an analog-digital multiplier 12E. Further, although not illustrated as well, a third output of the first layer generated with the same configuration is input to an analog-to-digital multiplier 12F.

Thereafter, a product-sum operation and activation function processing are performed in the second layer as with the first layer and transmitted to the third layer. The above-described processing is performed on a large number of digital signals input to the neural network circuit of the second embodiment up to a deep layer, and an AI recognition result is obtained from each output of the final layer.

Figure 10:
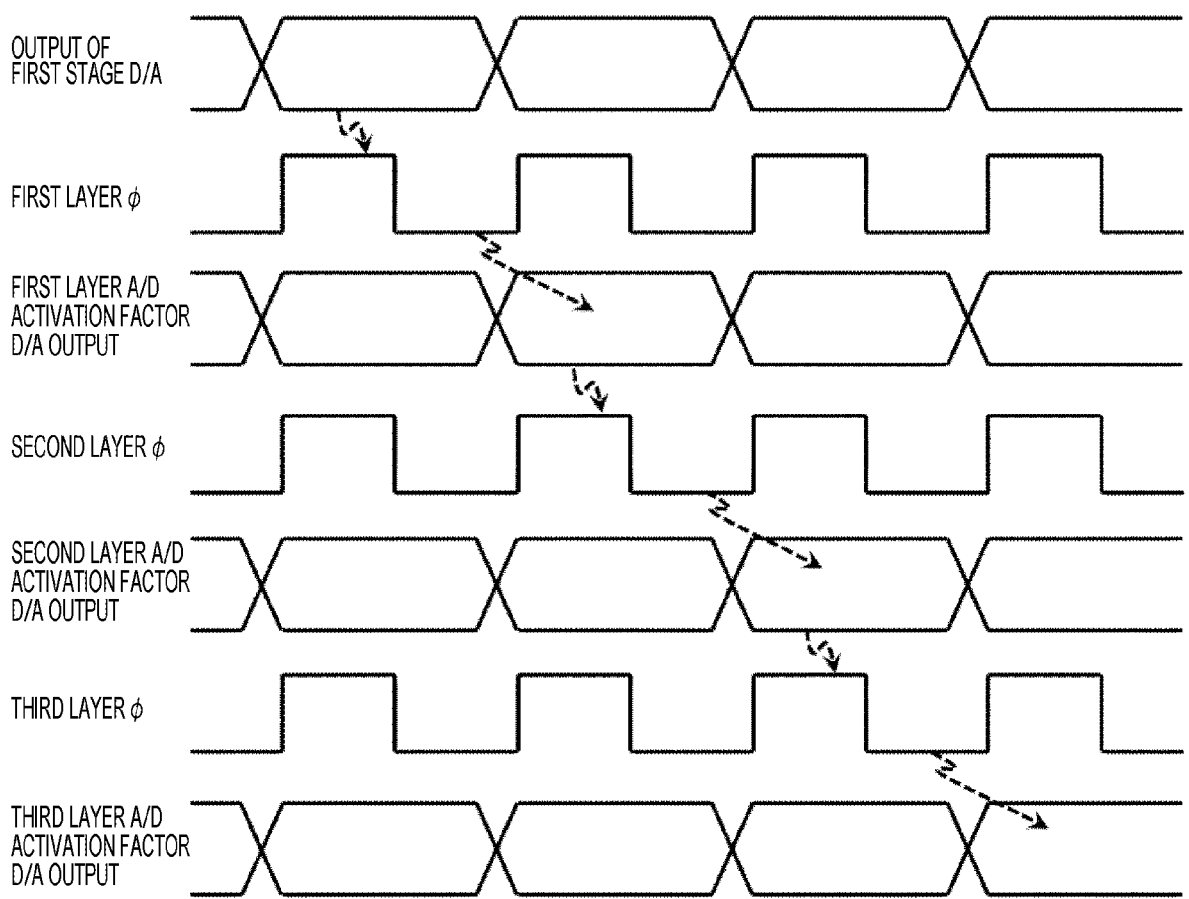
FIG. 10 is a diagram illustrating an operation time chart of the second embodiment.

The operation of the neural network circuit of the second embodiment will be described with reference to FIG. 10. As shown in the time chart of FIG. 10, the analog output voltages of the D/A converter 11A, the D/A converter 11B, and the D/A converter 11C of the initial stage are changed like the waveforms at the top of FIG. 10. On the other hand, the clock signal φ of each of the analog-to-digital multipliers belonging to the first layer has a waveform of "first layer φ" in FIG. 10.

As in the first embodiment, while the clock signal φ of the first layer is at high voltage, in each of the analog-to-digital multipliers belonging to the first layer, a MOS transistor 32, a MOS transistor 33, MOS transistor 34, a MOS transistor 35 in FIG. 3 are charged with a charge corresponding to the product of the analog input voltage input to the analog-to-digital multiplier and the weighting factor. Further, as in the first embodiment, while the clock signal φ of the first layer is at low voltage, a charge is discharged toward an output node of the analog-to-digital multiplier.

As in the first embodiment, the switch 13A, the switch 13B, and the switch 13C in FIG. 2 are turned on while the clock signal φ of the first layer is at low voltage. Thus, outputs of the analog-to-digital multiplier 12A, the analog-to-digital multiplier 12B, and the analog-to-digital multiplier 12C are connected to one another, and charge signals discharged therefrom are added. The added charge signal is charged on the wiring capacitance 16 to generate a first product-sum voltage.

The switch 15 is turned off during a period when the clock signal φ of the first layer is at low voltage.

Further, while the clock signal φ of the first layer is at low voltage, the A/D converter 21 performs A/D conversion for the first product-sum voltage and, for example, outputs the result of A/D conversion at the timing when the clock signal φ of the first layer comes to high voltage. Further, the digital activation function circuit 22 and the D/A converter 11D in the subsequent stage of the A/D converter 21 operate in response to the timing, and outputs thereof are updated. The second-layer analog-to-digital multiplier 12D, the analog-to-digital multiplier 12E, and the analog-to-digital multiplier 12F perform the above operation according to the clock signal φ of the second layer in FIG. 10.

In the second embodiment, in order to receive the updated output of the D/A converter 11D, the clock signal φ of the second layer has the same waveform as the clock signal φ of the first layer. Similarly, as the clock signal φ of the third or lower layer, a signal having the same waveform as the clock signal φ of the first layer can be applied.

As described above, in the second embodiment, one MOS transistor is used both in a capacitive element and a switch element by utilizing the on/off characteristics of the channel capacitance of the MOS transistor, and analog product-sum operation is performed in a charge region. As a result, the product-sum operations can be realized by a small-area analog circuit, and a large-scale neural network circuit can be integrated on a chip.

Furthermore, in the second embodiment, as compared with the first embodiment, although the A/D converter 21 and the D/A converter 11D are required, since a digital circuit can be applied to an activation function circuit, the calculation accuracy is improved.

Third Embodiment

The configuration of analog-to-digital multipliers 12A to 12C of a third embodiment will be described with reference to FIG. 4. In the third embodiment, each of MOS transistors in analog-to-digital multipliers of FIG. 3 is replaced with an NMOS instead of a PMOS. By using PMOS, the influence of 1/f noise can be reduced.

Figure 4:
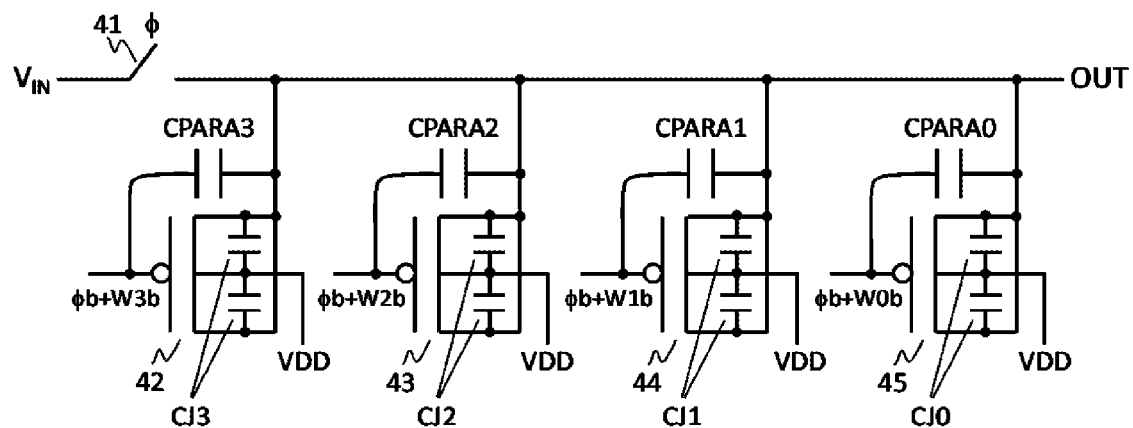
FIG. 4 is a diagram illustrating a configuration of an analog-to-digital multiplier of a third embodiment.

As illustrated in FIG. 4, an analog input voltage $V_{IN}$ of the analog-to-digital multipliers is connected to an output node OUT through a switch 41. On/off of the switch 41 is controlled based on a clock signal φ. In addition, digital input signals of the analog-to-digital multipliers, which are weighting factors, are represented by one or a plurality of bit signals. The third embodiment shows an example of four bits.

The analog-to-digital multiplier includes PMOS transistor 42, PMOS transistor 43, PMOS transistor 44, and PMOS transistor 45 each corresponding to four bit signals. Each PMOS transistor has a source terminal and drain terminal connected to the output node OUT. Voltages based on respective bit signals are applied to a gate terminal.

That is, when the weighting factor is represented by four-bit bit signals, W3, W2, W1, and W0, a logical sum (OR) output signal of an inverted signal of the clock signal φ and an inverted signal of the W3 signal is applied to the gate terminal of the PMOS transistor 42. To the gate terminal of the PMOS transistor 43, a logical sum (OR) output signal of an inverted signal of the clock signal φ and an inverted signal of the W2 signal is applied. To the gate terminal of the PMOS transistor 44, a logical sum (OR) output signal of an inverted signal of the clock signal φ and an inverted signal of the W1 signal is applied. To the gate terminal of the PMOS transistor 45, a logical sum (OR) output signal of an inverted signal of the clock signal φ and an inverted signal of the W0 signal is applied.

Back gate terminals of the PMOS transistor 42, the PMOS transistor 43, the PMOS transistor 44, and the PMOS transistor are connected to a power supply voltage (VDD) as a DC potential. These back gate terminals may be connected to a DC potential other than a power supply voltage.

Here, when W3 is MSB (Most Significant Bit) and W0 is LSB (Least Significant Bit) in the representation of weighting factors by W3, W2, W1, and W0 bit signals, for example, the gate width ratio of the PMOS transistor 42, the PMOS transistor 43, the PMOS transistor 44, and the PMOS transistor 45 may be selected to be 8:4:2:1.

While the clock signal φ is at high voltage, the switch 41 in FIG. 4 is turned on, and the analog input voltage $V_{IN}$ is applied onto the output node OUT. Further, as described above, a logical sum (OR) output signal of an inverted signal of the clock signal φ and an inverted signal of the W3 signal is applied to the gate terminal of the PMOS transistor 42. To the gate terminal of the PMOS transistor 43, a logical sum (OR) output signal of an inverted signal of the clock signal φ and an inverted signal of the W2 signal is applied. To the gate terminal of the PMOS transistor 44, a logical sum (OR) output signal of an inverted signal of the clock signal φ and an inverted signal of the W1 signal is applied. To the gate terminal of the PMOS transistor 45, a logical sum (OR) output signal of an inverted signal of the clock signal φ and an inverted signal of the W0 signal is applied.

Therefore, among the W3, W2, W1, and W0 bit signals, the gate voltage of the PMOS transistor corresponding to the bit signal at high voltage (logical value=1) comes to low voltage, that is, a ground potential. The gate voltage of the PMOS transistor corresponding to the bit signal which is at low voltage (logic value=0) comes to high voltage, that is, a voltage equal to a power supply voltage.

Therefore, the PMOS transistor corresponding to the bit signal which is at high voltage is turned on, and a channel capacitance proportional to the gate width is formed between the gate terminal and the connected source and drain terminals. The connected source terminal and drain terminal are connected to the output node OUT to which the analog input voltage $V_{IN}$ is applied. Therefore, a charge corresponding to the product of the analog input voltage $V_{IN}$ and the gate width is charged in the channel capacitance of the PMOS transistor corresponding to the bit signal which is at high voltage. On the other hand, a PMOS transistor corresponding to a bit signal at low voltage is turned off, and a channel capacitance is not formed, such that an electrical charge is not charged either.

From the above, the total charge amount charged in the PMOS transistor 42, the PMOS transistor 43, the PMOS transistor 44, and the PMOS transistor 45 while the clock signal φ is at high voltage is proportional to $V_{IN}\times(8\times W3+4\times W2+2\times W1+1\times W0)$. That is, the charge amount corresponds to the product of the analog input voltage and the value of the weighting factor.

CPARA3, CPARA2, CPARA1 and CPARA0 in FIG. 4 are the sum of a channel capacitance value, an overlap capacitance value of a fixed value between a gate terminal and a source terminal, and an overlap capacitance value of a fixed value between a gate terminal and a drain terminal. As described above, the presence or absence of the channel capacitance value is controlled. Further, CJ3, CJ2, CJ1 and CJ0 in FIG. 4 are junction capacitance values of fixed values of the PMOS transistor 42, PMOS transistor 43, PMOS transistor 44, and PMOS transistor 45. In the present invention, as described above, it is necessary that the channel capacitance value capable of controlling the presence or absence is sufficiently larger than the sum of the fixed overlap capacitance value and the junction capacitance value. Therefore, the gate lengths of the PMOS transistor 42, the PMOS transistor 43, the PMOS transistor 44, and the PMOS transistor 45 are made long as necessary to satisfy this condition.

While the clock signal φ is at low voltage, the switch 41 is turned off, and an analog input voltage is cut off from the output node OUT. Further, as described above, a logical sum (OR) output signal of an inverted signal of the clock signal φ and an inverted signal of the W3 signal is applied to the gate terminal of the PMOS transistor 42. To the gate terminal of the PMOS transistor 43, a logical sum (OR) output signal of an inverted signal of the clock signal φ and an inverted signal of the W2 signal is applied. To the gate terminal of the PMOS transistor 44, a logical sum (OR) output signal of an inverted signal of the clock signal φ and an inverted signal of the W1 signal is applied. To the gate terminal of the PMOS transistor 45, a logical sum (OR) output signal of an inverted signal of the clock signal φ and an inverted signal of the W0 signal is applied.

Therefore, while the clock signal φ is at low voltage, the gate voltages of the PMOS transistor 42, the PMOS transistor 43, the PMOS transistor 44, and the PMOS transistor 45 are all power supply voltages. Therefore, the PMOS transistor 42, the PMOS transistor 43, the PMOS transistor 44, and the PMOS transistor are all turned off, and channel capacitances disappear. Therefore, a charge amount corresponding to the product of an analog input voltage and the value of a weighting factor is discharged from the PMOS transistor 42, the PMOS transistor 43, the PMOS transistor 44, and the PMOS transistor 45 toward the output node OUT as a charge signal. The other operations are the same as in the first embodiment and the second embodiment, and thus the description thereof will be omitted.

In the third embodiment, one MOS transistor is used both in a capacitive element and a switch element by utilizing the on/off characteristics of the channel capacitance of the MOS transistor, and analog product-sum operation is performed in a charge region. As a result, the product-sum operations can be realized by a small-area analog circuit, and a large-scale neural network circuit can be integrated on a chip.

Fourth Embodiment

Figure 5:
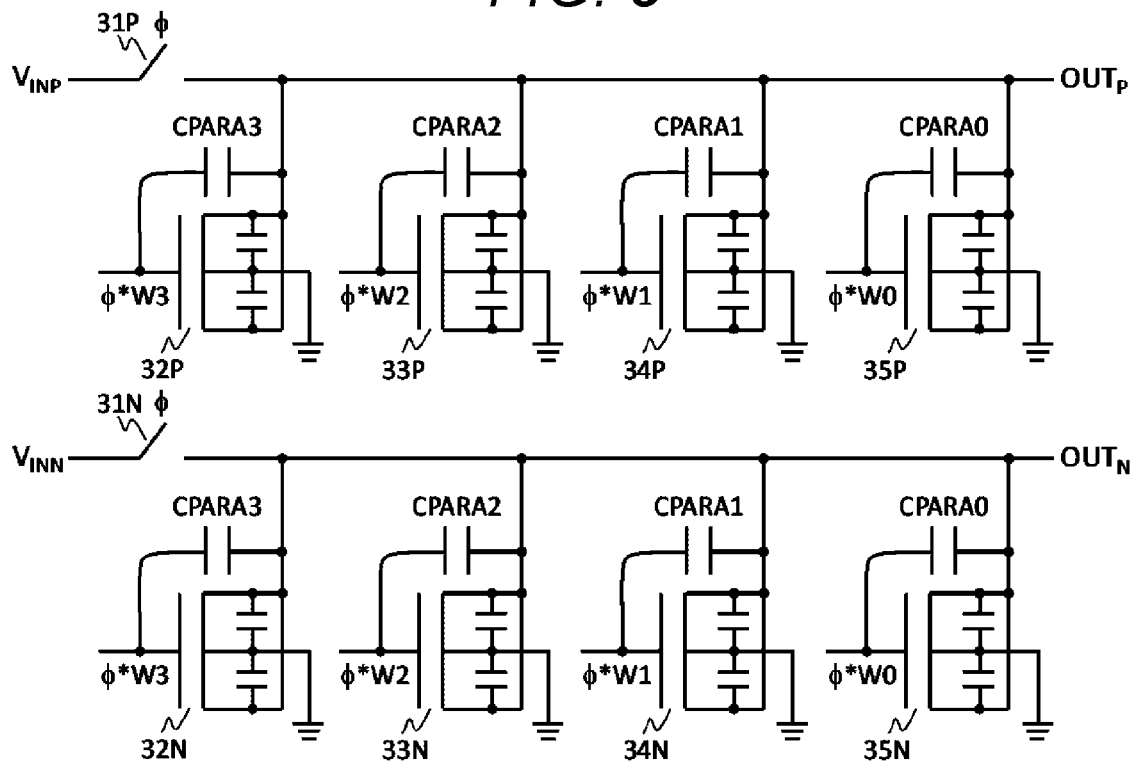
FIG. 5 is a diagram illustrating a configuration of an analog-to-digital multiplier of a fourth embodiment.

The configurations of analog-to-digital multipliers 12A to 12C of a fourth embodiment will be described with reference to FIG. 5. As illustrated in FIG. 5, in the fourth embodiment, the analog-to-digital multiplier of FIG. 3 has a differential circuit configuration. That is, the analog input voltage $V_{IN}$ is a voltage difference between a positive input voltage $V_{INP}$ and a negative input voltage $V_{INN}$. The positive input voltage $V_{INP}$ is connected to a positive output node $OUT_P$ via a positive switch 31P. The source terminal and drain terminal of each of the positive side MOS transistors 32P, 33P, 34P, and 35P are connected to the positive output node $OUT_P$.

The negative input voltage $V_{INN}$ is connected to the negative output node $OUT_N$ via a negative switch 31N. The source terminal and the drain terminal of each of the negative side MOS transistors 32N, 33N, 34N, and 35N are connected to the negative output node $OUT_N$. Further, voltages based on respective bit signals are applied to the MOS transistors 32P and 32N, the MOS transistors 33P and 33N, the MOS transistors 34P and 34N, and the MOS transistors 35P and 35N.

That is, when the weighting factor is represented by four-bit bit signals, W3, W2, W1 and W0, a logical product (AND) output signal of the clock signal φ and the W3 signal is applied to the gate terminals of the MOS transistors 32P and 32N. A logical product (AND) output signal of the clock signal φ and the W2 signal is applied to the gate terminals of the MOS transistors 33P and 33N. A logical product (AND) output signal of the clock signal φ and the W1 signal is applied to the gate terminals of the MOS transistors 34P and 34N. A logical product (AND) output signal of the clock signal φ and the W0 signal is applied to the gate terminals of the MOS transistors 35P and 35N.

The back gate terminals of the MOS transistors 32P and 32N, the MOS transistors 33P and 33N, the MOS transistors 34P and 34N, and the MOS transistors 35P and 35N are connected to a ground potential as a DC potential. Note that these back gate terminals may be connected to a DC potential other than the ground potential.

Here, when W3 is MSB (Most Significant Bit) and W0 is LSB (Least Significant Bit) in the representation of weighting factors by W3, W2, W1, and W0 bit signals, for example, the gate width ratio of the MOS transistors 32P and 32N, the MOS transistors 33P and 33N, the MOS transistors 34P and 34N, and the MOS transistors 35P and 35N may be selected to be 8:4:2:1.

In the above-described differential circuit configuration, the operation as in the description of FIG. 3 in the first embodiment is performed. While the clock signal φ is at low voltage, a charge corresponding to $V_{INP}\times(8\times W3+4\times W2+2\times W1+1\times W0)$ is discharged to the positive output node $OUT_P$. A charge corresponding to $V_{INN}\times(8\times W3+4\times W2+2\times W1+1\times W0)$ is discharged to the negative output node $OUT_N$. The output signal of the analog-to-digital multiplier of the fourth embodiment is the difference between the charge discharged to the positive output node $OUT_P$ and the charge discharged to the negative output node $OUT_N$, and therefore it becomes a charge corresponding to $V_{IN}\times(8\times W3+4\times W2+2\times W1+1\times W0)$.

In the fourth embodiment, the influence of a charge (charge called clock feedthrough) associated with charge and discharge of the overlap capacitance by the clock signal φ is canceled between the differentials and does not appear in an output signal. That is, the charge actually discharged to the positive output node $OUT_P$ contains a charge associated with charge and discharge of the overlap capacitance by the clock signal φ, in addition to a component corresponding to $V_{INP} \times (8 \times W3 + 4 \times W2 + 2 \times W1 + 1 \times W0)$. Further, the charge actually discharged to the negative output node $OUT_N$ contains a charge associated with charge and discharge of the overlap capacitance by the clock signal φ, in addition to a component corresponding to $V_{INN} \times (8 \times W3 + 4 \times W2 + 2 \times W1 + 1 \times W0)$.

However, the charge associated with charge and discharge of the overlap capacitance by the clock signal φ is contained in the same amount as the charge discharged to the positive output node $OUT_P$ and the charge discharged to the negative output node $OUT_N$. Therefore, the charge is canceled and do not appear in the output signal of the analog-to-digital multiplier, which is a difference therebetween.

Fifth Embodiment

Figure 6:
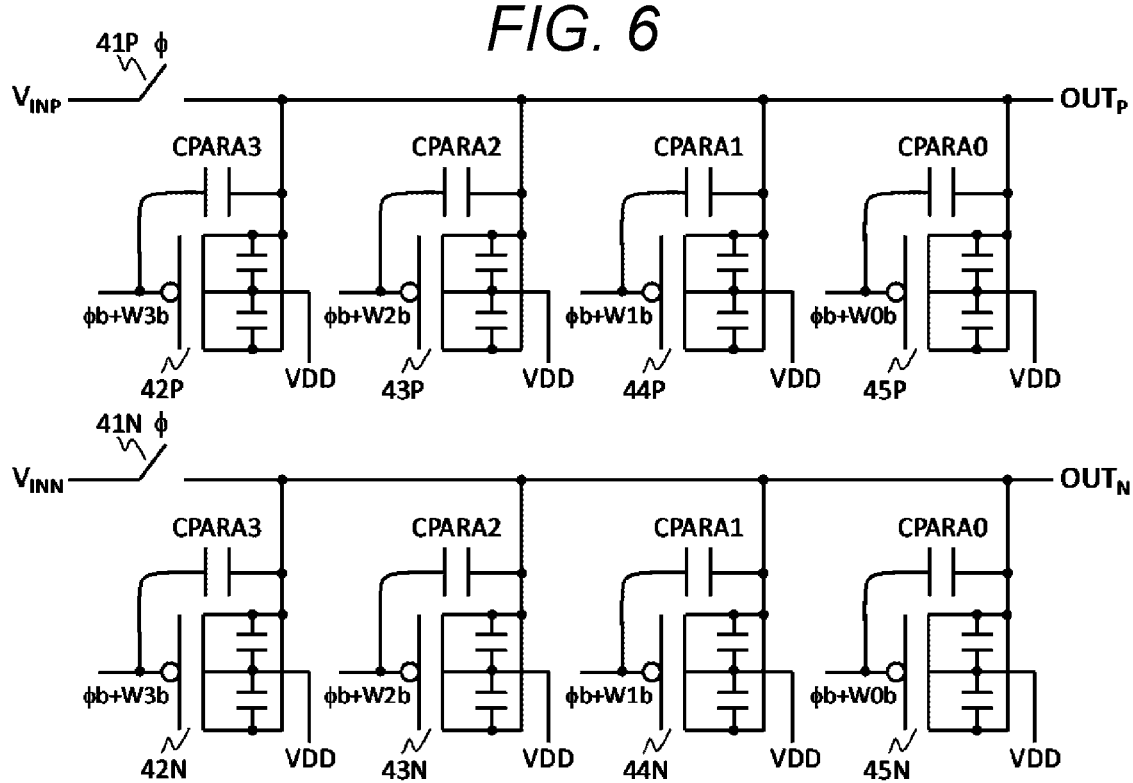
FIG. 6 is a diagram illustrating a configuration of an analog-to-digital multiplier of a fifth embodiment.

The configuration of analog-to-digital multipliers 12A to 12C according to a fifth embodiment will be described with reference to FIG. 6. In the fifth embodiment, a PMOS type analog-to-digital multiplying unit of FIG. 4 has a differential circuit configuration. That is, the analog input voltage $V_{IN}$ is a voltage difference between a positive input voltage $V_{INP}$ and a negative input voltage $V_{INN}$. The positive side input voltage $V_{INP}$ is connected to a positive output node $OUT_P$ via a positive switch 41P. Further, source and drain terminals of each of PMOS transistors 42P, 43P, 44P, and 45P on the positive side are connected to the positive output node $OUT_P$.

The negative input voltage $V_{INN}$ is connected to a negative output node $OUT_N$ through a negative switch 41N. Source and drain terminals of each of PMOS transistors 42N, 43N, 44N, 45N on the negative side are connected to the negative output node $OUT_N$.

Voltages based on respective bit signals are applied to the PMOS transistors 42P and 42N, the PMOS transistors 43P and 43N, the PMOS transistors 44P and 44N, and the PMOS transistors 45P and 45N. That is, when a weighting factor is represented by four-bit bit signals of W3, W2, W1, and W0, a logical sum (OR) output signal of an inverted signal of a clock signal φ and an inverted signal of the W3 signal is applied to the gate terminals of the PMOS transistors 42P and 42N. A logical sum (OR) output signal of an inverted signal of the clock signal φ and an inverted signal of the W2 signal is applied to the gate terminals of the PMOS transistors 43P and 43N.

To the gate terminals of the PMOS transistors 44P and 44N, a logical sum (OR) output signal of an inverted signal of the clock signal φ and an inverted signal of the W1 signal is applied. To the gate terminals of the PMOS transistor 45P and 45N, a logical sum (OR) output signal of an inverted signal of the clock signal φ and an inverted signal of the W0 signal is applied. Further, the back gate terminals of the PMOS transistors 42P and 42N, the PMOS transistors 43P and 43N, the PMOS transistors 44P and 44N, and the PMOS transistors 45P and 45N are connected to a power supply voltage.

These back gate terminals may be connected to a DC potential other than a power supply voltage. Here, when W3 is MSB (Most Significant Bit) and W0 is LSB (Least Significant Bit) in the representation of weighting factors by W3, W2, W1, and W0 bit signals, for example, the gate width ratio of the PMOS transistors 42P and 42N, the PMOS transistors 43P and 43N, the PMOS transistors 44P and 44N, and the PMOS transistors 45P and 45N may be selected to be 8:4:2:1.

In the above-described differential circuit configuration, the same operation as the description of FIG. 4 in the third embodiment is performed. While the clock signal φ is at low voltage, a charge corresponding to $V_{INP} \times (8 \times W3 + 4 \times W2 + 2 \times W1 + 1 \times W0)$ is discharged to the positive output node $OUT_P$. A charge corresponding to $V_{INN} \times (8 \times W3 + 4 \times W2 + 2 \times W1 + 1 \times W0)$ is discharged to the negative output node $OUT_N$. The output signal of the analog-to-digital multiplier of the fifth embodiment is the difference between the charge discharged to the positive output node $OUT_P$ and the charge discharged to the negative output node $OUT_N$, and therefore it becomes a charge corresponding to $V_{IN} \times (8 \times W3 + 4 \times W2 + 2 \times W1 + 1 \times W0)$.

In the fifth embodiment, as in the fourth embodiment, the influence of a charge (charge called clock feedthrough) associated with charge and discharge of the overlap capacitance by an inverted signal of the clock signal φ is canceled between the differentials and does not appear in an output signal. That is, the charge actually discharged to the positive output node $OUT_P$ contains a charge associated with charge and discharge of the overlap capacitance by an inverted signal of the clock signal φ, in addition to a component corresponding to $V_{INP} \times (8 \times W3 + 4 \times W2 + 2 \times W1 + 1 \times W0)$. Further, the charge actually discharged to the negative output node $OUT_N$ contains a charge associated with charge and discharge of the overlap capacitance by an inverted signal of the clock signal φ, in addition to a component corresponding to $V_{INN} \times (8 \times W3 + 4 \times W2 + 2 \times W1 + 1 \times W0)$.

However, the charges associated with charge and discharge of the overlap capacitance by an inverted signal of the clock signal φ are contained in the same amount as the charge discharged to the positive output node $OUT_P$ and the charge discharged to the negative output node $OUT_N$. Therefore, the charges are canceled and do not appear in the output signal of the analog-to-digital multiplier which is a difference therebetween.

Sixth Embodiment

Figure 7:
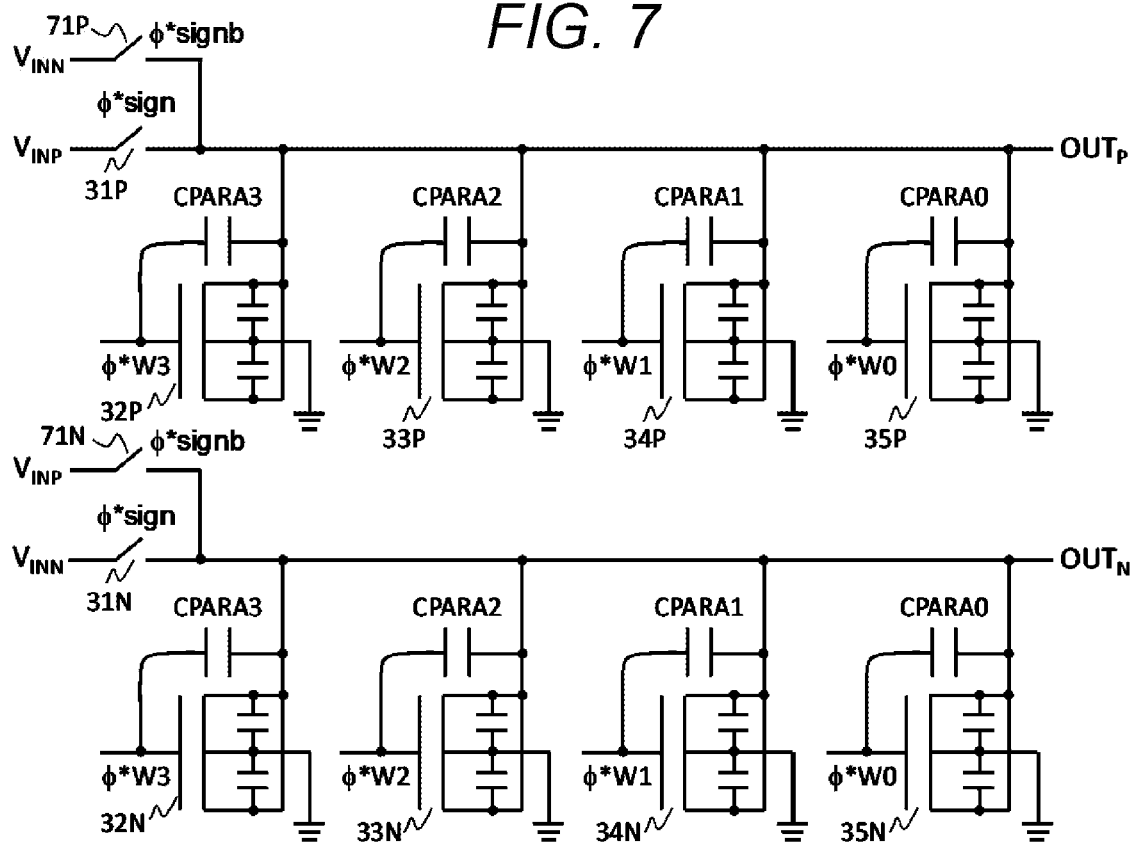
FIG. 7 is a diagram illustrating a configuration of an analog-to-digital multiplier of a sixth embodiment.

The configuration of analog-to-digital multipliers 12A to 12C of a sixth embodiment will be described with reference to FIG. 7. In the sixth embodiment, by adding switches 71P and 71N with respect to the fourth embodiment of FIG. 5, multiplication with respect to a negative weight factor is enabled. The switch 71P is inserted between a negative input voltage $V_{INN}$ and a positive output node $OUT_P$, and the switch 71N is inserted between a positive input voltage $V_{INP}$ and a negative output node $OUT_N$.

In the above configuration, when multiplication of an analog input voltage $V_{IN}$, which is a voltage difference between the positive input voltage $V_{INP}$ and the negative input voltage $V_{INN}$, and a positive weighting factor is performed, while a clock signal φ is at high voltage, as described above, switches 31P and 31N are turned on, and the switches 71P and 71N are turned off. As a result, an output signal of the analog-to-digital multiplier becomes a charge corresponding to $V_{IN} \times (8 \times W3 + 4 \times W2 + 2 \times W1 + 1 \times W0)$.

On the other hand, when the multiplication of the analog input voltage $V_{IN}$ and the negative weight factor is performed, while the clock signal φ is at high voltage, the switches 31P and 31N are turned off, and the switches 71P and 71N are turned on. As a result, a charge corresponding to the negative input voltage $V_{INN}$ are charged in MOS transistors 32P, 33P, 34P, and 35P on the positive side. Further, a charge corresponding to the positive side input voltage $V_{INP}$ is charged in MOS transistors 32N, 33N, 34N and 35N on the negative side.

Therefore, while the clock signal φ is at low voltage, a charge corresponding to $V_{INN} \times (8 \times W3 + 4 \times W2 + 2 \times W1 + 1 \times W0)$ is discharged to the positive output node $OUT_P$. A charge corresponding to $V_{INP} \times (8 \times W3 + 4 \times W2 + 2 \times W1 + 1 \times W0)$ is discharged to the negative output node $OUT_N$. An output signal of the analog-to-digital multiplier is a difference between the charge discharged to the positive output node $OUT_P$ and the charge discharged to the negative output node $OUT_N$, and therefore it becomes a charge corresponding to $-V_{IN} \times (8 \times W3 + 4 \times W2 + 2 \times W1 + 1 \times W0)$. Since this is equal to $V_{IN} \times \{-(8 \times W3 + 4 \times W2 + 2 \times W1 + 1 \times W0)\}$, it means that an analog input voltage is multiplied by a negative weight factor.

In the sixth embodiment, as described above, multiplication with a negative weighting factor can be realized, and as in the fourth embodiment, the influence of a charge associated with charge and discharge of an overlap capacitance by the clock signal φ can be canceled.

Seventh Embodiment

Figure 8:
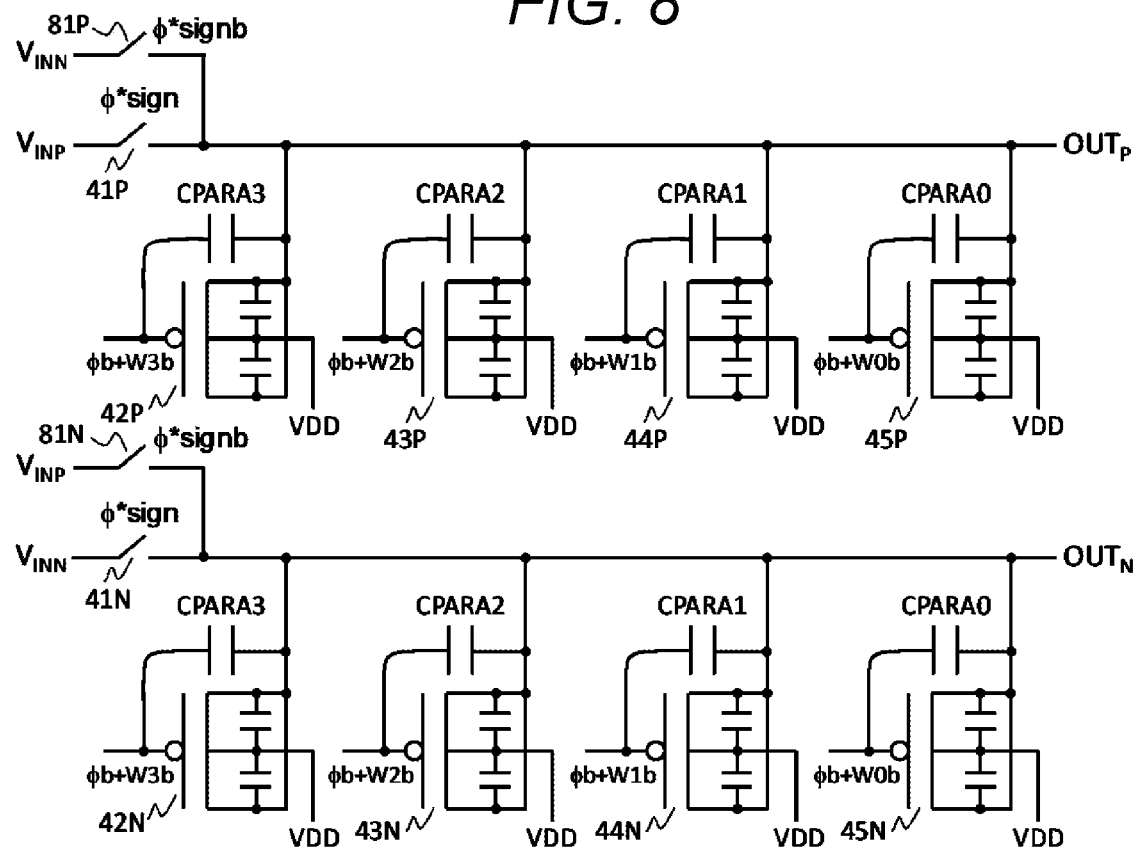
FIG. 8 is a diagram illustrating a configuration of an analog-to-digital multiplier of a seventh embodiment.

The configuration of analog-to-digital multipliers 12A to 12C of a seventh embodiment will be described with reference to FIG. 8.

In the seventh embodiment, the PMOS type analog-to-digital multiplier described in the third embodiment is applied to the sixth embodiment. Therefore, the operation and effects are the same as those in the embodiments, and the description thereof will be omitted.

Eighth Embodiment

The configuration of analog-to-digital multipliers 12A to 12C of an eighth embodiment will be described with reference to FIG. 11. In the eighth embodiment, connections to a gate terminal and to a source and drain terminals of each MOS transistor in the analog-to-digital multiplier of FIG. 3 are switched.

That is, an analog input voltage $V_{IN}$ of the analog-to-digital multiplier is connected to an output node OUT via a switch 31. On/off of the switch 31 is controlled based on a clock signal φ. In addition, digital input signals of the analog-to-digital multipliers, which are weighting factors, are represented by one or a plurality of bit signals. The eighth embodiment shows an example of four bits.

The analog-to-digital multipliers include a MOS transistor 32, a MOS transistor 33, a MOS transistor 34, and a MOS transistor 35 each corresponding to four bit signals. Each MOS transistor has a gate terminal connected to the output node OUT, also its source and drain terminals are connected, and a voltage based on each bit signal is applied.

That is, when the weighting factor is represented by four-bit bit signals of W3, W2, W1, and W0, a logical sum (OR) output signal of an inverted signal of the clock signal φ and an inverted signal of the W3 signal is applied to the source terminal and the drain terminal of the MOS transistor 32. A logical sum (OR) output signal of the inverted signal of the clock signal φ and the inverted signal of the W2 signal is applied to the source terminal and the drain terminal of the MOS transistor 33. A logical sum (OR) output signal of the inverted signal of the clock signal φ and the inverted signal of the W1 signal is applied to the source terminal and the drain terminal of the MOS transistor 34. A logical sum (OR) output signal of the inverted signal of the clock signal φ and the inverted signal of the W0 signal is applied to the source terminal and the drain terminal of the MOS transistor 35.

Back gate terminals of the MOS transistor 32, the MOS transistor 33, the MOS transistor 34, and the MOS transistor 35 are connected to a ground potential as a DC potential. Note that these back gate terminals may be connected to a DC potential other than the ground potential. Here, when W3 is MSB (Most Significant Bit) and W0 is LSB (Least Significant Bit) in the representation of the weighting factors by the W3, W2, W1, and W0 bit signals, for example, the gate width ratio of the MOS transistor 32, the MOS transistor 33, the MOS transistor 34, and the MOS transistor 35 may be selected to be 8:4:2:1.

Figure 11:
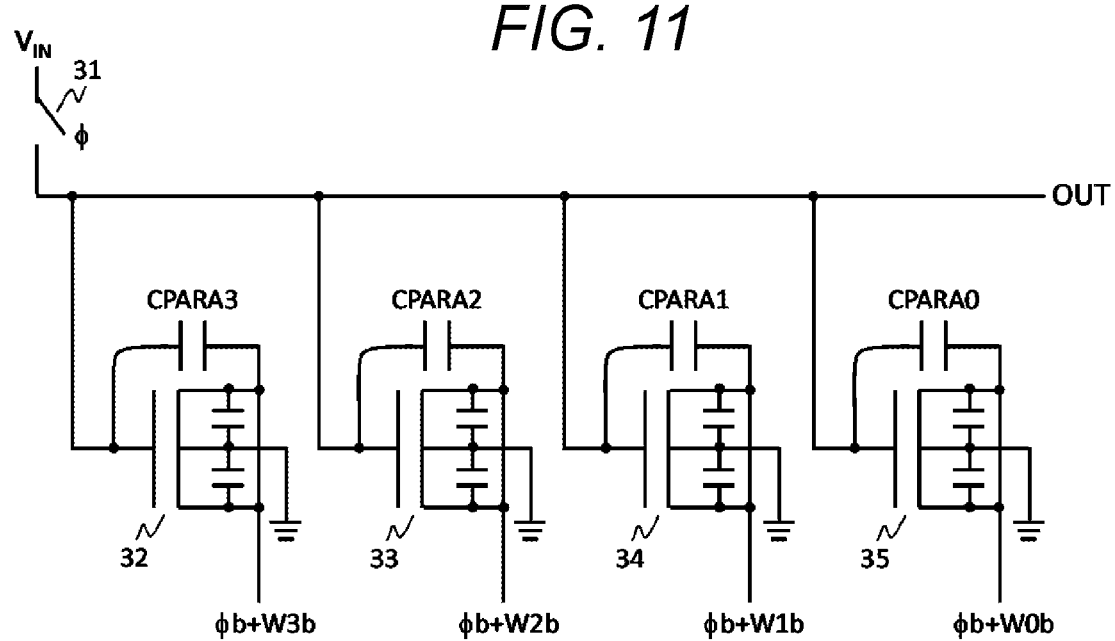
FIG. 11 is a diagram illustrating a configuration of an analog-to-digital multiplier of an eighth embodiment.

While the clock signal φ is at high voltage, the switch 31 in FIG. 11 is turned on, and the analog input voltage $V_{IN}$ is applied onto the output node OUT. Further, as described above, a logical sum (OR) output signal of the inverted signal of the clock signal φ and the inverted signal of the W3 signal is applied to the source terminal and the drain terminal of the MOS transistor 32. A logical sum (OR) output signal of the inverted signal of the clock signal φ and the inverted signal of the W2 signal is applied to the source terminal and the drain terminal of the MOS transistor 33. A logical sum (OR) output signal of the inverted signal of the clock signal φ and the inverted signal of the W1 signal is applied to the source terminal and the drain terminal of the MOS transistor 34. A logical sum (OR) output signal of the inverted signal of the clock signal φ and the inverted signal of the W0 signal is applied to the source terminal and the drain terminal of the MOS transistor 35.

Therefore, among the W3, W2, W1, and W0 bit signals, the source terminal and the drain terminal of the MOS transistor corresponding to the bit signal which is at high voltage (logical value=1) come to low voltage, that is, a ground potential. The source terminal and the drain terminal of the MOS transistor corresponding to the bit signal which is at low voltage (logical value=0) come to high voltage, that is, a voltage equal to a power supply voltage.

Therefore, the MOS transistor corresponding to a high voltage bit signal is turned on, and a channel capacitance proportional to a gate width is formed between the gate terminal, the source terminal, and the drain terminal of the MOS transistor. Since the gate terminal is connected to the output node OUT to which the analog input voltage $V_{IN}$ is applied, a charge corresponding to the product of the analog input voltage $V_{IN}$ and the gate width is charged to the channel capacitance of the MOS transistor corresponding to the bit signal which is at high voltage. On the other hand, the MOS transistor corresponding to the bit signal which is at low voltage is turned off, and the channel capacitance is not formed, such that the charge is not charged either.

From the above, the total amount of the charge charged in the MOS transistor 32, the MOS transistor 33, the MOS transistor 34, and the MOS transistor 35 while the clock signal φ is at high voltage is proportional to $V_{IN} \times (8 \times W3 + 4 \times W2 + 2 \times W1 + 1 \times W0)$. That is, the charge amount corresponds to the product of the analog input voltage and the value of the weighting factor.

CPARA3, CPARA2, CPARA1, and CPARA0 in FIG. 11 are the sum of a channel capacitance value, an overlap capacitance value of a fixed value between gate and source terminals, and an overlap capacitance value of the fixed value between gate and drain terminals. As described above, the presence or absence of a capacitance value is controlled. In the present invention, as described above, it is necessary that the channel capacitance value capable of controlling the presence or absence is sufficiently larger than the sum of fixed overlap capacitance values. Therefore, the gate lengths of the MOS transistors 32, 33, 34, and 35 are made long as necessary to satisfy this condition. Now that, in this configuration, since the analog input voltage $V_{IN}$ is not charged to a junction capacitance of the MOS transistor, there is an advantage not to be affected by a junction capacitance.

While the clock signal φ is at low voltage, the switch 31 is turned off, and an analog input voltage is cut off from the output node OUT. Further, as described above, a logical sum (OR) output signal of the inverted signal of the clock signal φ and the inverted signal of the W3 signal is applied to the source terminal and the drain terminal of the MOS transistor 32. A logical sum (OR) output signal of the inverted signal of the clock signal φ and the inverted signal of the W2 signal is applied to the source terminal and the drain terminal of the MOS transistor 33. A logical sum (OR) output signal of the inverted signal of the clock signal φ and the inverted signal of the W1 signal is applied to the source terminal and the drain terminal of the MOS transistor 34. A logical sum (OR) output signal of the inverted signal of the clock signal φ and the inverted signal of the W0 signal is applied to the source terminal and the drain terminal of the MOS transistor 35.

Therefore, while the clock signal φ is at low voltage, the power supply voltage is applied to both the source terminal and the drain terminal of each of the MOS transistor 32, the MOS transistor 33, the MOS transistor 34, and the MOS transistor 35. Therefore, the MOS transistor 32, the MOS transistor 33, the MOS transistor 34, and the MOS transistor 35 are all turned off, and a channel capacitance disappears. Therefore, the charge amount corresponding to the product of the analog input voltage and the value of the weighting factor is discharged from the MOS transistor 32, the MOS transistor 33, the MOS transistor 34, and the MOS transistor 35 toward the output node OUT as a charge signal. The other operations are the same as in the first embodiment and the second embodiment, and therefore the description thereof will be omitted.

In the eighth embodiment, one MOS transistor is used both in a capacitive element and a switch element by utilizing the on/off characteristics of the channel capacitance of the MOS transistor, and analog product-sum operation is performed in a charge region. As a result, the product-sum operations can be realized by a small-area analog circuit, and a large-scale neural network circuit can be integrated on a chip.

What is claimed is:

1. A neural network circuit, comprising:
   a plurality of D/A converters configured to convert a digital input signal into an analog input voltage;
   a plurality of analog-to-digital multipliers each connected to the D/A converters and configured to output a predetermined multiplication result obtained by multiplying the analog input voltage by a weighting factor which is a digital signal;
   a capacitance configured to hold an addition result obtained by adding a plurality of the multiplication results;
   an analog activation function circuit configured to perform analog processing corresponding to an activation function on the addition result; and
   a switch configured to discharge an alternating current component of a charge on the capacitor,
   wherein each of the analog-to-digital multipliers includes an output node to which the analog-to-digital input voltage is connected, and a MOS transistor provided corresponding to at least one bit signal corresponding to the digital signal,
   the MOS transistor has a source terminal, a drain terminal, and a gate terminal,
   the source terminal and the drain terminal are connected to the output node,
   a voltage based on the bit signal is applied to the gate terminal,
   a charge signal corresponding to the product of the analog input voltage and the bit signal is output as the multiplication result, and
   a plurality of the analog-to-digital multipliers generates an analog product-sum voltage corresponding to the sum of the charge signals of each of the analog-to-digital multipliers on the capacitance by connecting the output nodes.

2. The neural network circuit according to claim 1, wherein
   the analog-to-digital multiplier
   further includes a switch configured to connect the analog input voltage to the output node, and
   generates the analog product-sum voltage corresponding to the sum of the charge signals when the charge signal of each analog-to-digital multiplier is added by controlling the switch.

3. The neural network circuit according to claim 1, wherein
   the analog activation function circuit performs the analog processing corresponding to the activation function on the analog product-sum voltage as the addition result, and outputs the processing result as an analog voltage.

4. The neural network circuit according to claim 1, wherein the MOS transistor further has a back gate terminal, and
   the back gate terminal is fixed to a DC potential.

5. The neural network circuit according to claim 4, wherein the MOS transistor includes an NMOS, and
   the back gate terminal is fixed to a ground potential as the DC potential.

6. The neural network circuit according to claim 4, wherein the MOS transistor includes a PMOS, and
   the back gate terminal is fixed to a power supply voltage as the DC potential.

7. The neural network circuit according to claim 1, wherein in the analog-to-digital multiplier,
   the analog input voltage is represented by a differential signal consisting of a positive input voltage and a negative input voltage,
   the positive input voltage is connected to the positive output node via a first switch,
   the source terminal and the drain terminal of the positive side MOS transistor are connected to the positive output node,
   the negative input voltage is connected to the negative output node via a second switch,
   the source terminal and the drain terminal of the negative side MOS transistor are connected to the negative output node,
   a voltage based on the bit signal is applied each to the gate terminal of the positive side MOS transistor and the gate terminal of the negative side MOS transistor, and
   by controlling the first switch and the second switch, the charge signal of each of the analog-to-digital multipliers is added, and the analog product-sum voltage corresponding to the sum of the charge signals is generated.

8. The neural network circuit according to claim 7, wherein the analog-to-digital multiplier further comprises:
a third switch configured to connect the positive input voltage to the negative output node; and
a fourth switch configured to connect the negative input voltage to the positive output node, and
the first switch, the second switch, the third switch, and the fourth switch are controlled based on the positive/negative signals of the digital signal to generate the analog product-sum voltage.

9. A neural network circuit, comprising:
a plurality of D/A converters configured to convert a digital input signal into an analog input voltage;
a plurality of analog-to-digital multipliers each connected to the D/A converters and configured to output a predetermined multiplication result obtained by multiplying the analog input voltage by a weighting factor which is a digital signal;
a capacitance configured to hold an addition result obtained by adding a plurality of the multiplication results;
an analog activation function circuit configured to perform analog processing corresponding to an activation function on the addition result; and
a switch configured to discharge an alternating current component of a charge on the capacitor,
wherein each of the analog-to-digital multipliers includes an output node to which the analog-to-digital input voltage is connected, and a MOS transistor provided corresponding to at least one bit signal corresponding to the digital signal,
the MOS transistor has a source terminal, a drain terminal, and a gate terminal,
the gate terminal and the drain terminal are connected to the output node,
a voltage based on the bit signal is applied to the source terminal and the drain terminal,
a charge signal corresponding to the product of the analog input voltage and the bit signal is output as the multiplication result, and
a plurality of the analog-to-digital multipliers generates an analog product-sum voltage corresponding to the sum of the charge signals of each of the analog-to-digital multipliers on the capacitance by connecting the output nodes.

10. The neural network circuit according to claim 9, wherein the analog-to-digital multiplier
further includes a switch configured to connect the analog input voltage to the output node, and
generates the analog product-sum voltage corresponding to the sum of the charge signals when the charge signal of each analog-to-digital multiplier is added by controlling the switch.

11. The neural network circuit according to claim 9, wherein the analog activation function circuit
performs the analog processing corresponding to the activation function on the analog product-sum voltage as the addition result and outputs the processing result as an analog voltage.

12. A neural network circuit, comprising:
a plurality of first D/A converters configured to convert a digital input signal into an analog input voltage;
a plurality of analog-to-digital multipliers each connected to the first D/A converters and configured to output a predetermined multiplication result, as an analog signal, obtained by multiplying the analog input voltage by a weighting factor which is a digital signal;
a capacitance configured to hold an addition result obtained by adding a plurality of the multiplication results;
an A/D converter configured to convert the addition result that is an analog voltage into a digital signal;
a digital activation function circuit configured to perform digital processing corresponding to an activation function on the addition result as the digital signal output from the A/D converter;
a second D/A converter configured to convert a digital output signal of the digital activation function circuit into an analog voltage; and
a switch configured to discharge an alternating current component of a charge on the capacitor,
wherein each of the analog-to-digital multipliers includes an output node to which the analog-to-digital input voltage is connected, and a MOS transistor provided corresponding to at least one bit signal corresponding to the digital signal,
the MOS transistor has a source terminal, a drain terminal, and a gate terminal,
the source terminal and the drain terminal are connected to the output node,
a voltage based on the bit signal is applied to the gate terminal,
a charge signal corresponding to the product of the analog input voltage and the bit signal is output as the multiplication result, and
a plurality of the analog-to-digital multipliers generates an analog product-sum voltage corresponding to the sum of the charge signals of each of the analog-to-digital multipliers on the capacitance by connecting the output nodes.

13. The neural network circuit according to claim 12, wherein the analog-to-digital multiplier
further includes a switch configured to connect the analog input voltage to the output node, and
generates the analog product-sum voltage corresponding to the sum of the charge signals when the charge signal of each analog-to-digital multiplier is added by controlling the switch.

* * * * *